US011495298B1

United States Patent
Hsu et al.

(10) Patent No.: US 11,495,298 B1
(45) Date of Patent: Nov. 8, 2022

(54) THREE DIMENSION MEMORY DEVICE AND TERNARY CONTENT ADDRESSABLE MEMORY CELL THEREOF

(71) Applicant: MACRONIX International Co., Ltd., Hsinchu (TW)

(72) Inventors: Po-Kai Hsu, Tainan (TW); Teng-Hao Yeh, Hsinchu County (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/465,651

(22) Filed: Sep. 2, 2021

(51) Int. Cl.
*G11C 16/10* (2006.01)
*G11C 15/04* (2006.01)
*G11C 16/28* (2006.01)
*G11C 16/30* (2006.01)
*G11C 16/24* (2006.01)

(52) U.S. Cl.
CPC .......... *G11C 16/102* (2013.01); *G11C 15/046* (2013.01); *G11C 16/24* (2013.01); *G11C 16/28* (2013.01); *G11C 16/30* (2013.01)

(58) Field of Classification Search
CPC ....... G11C 16/102; G11C 16/24; G11C 16/28; G11C 16/30; G11C 15/046
See application file for complete search history.

(56) References Cited

U.S. PATENT DOCUMENTS

| 6,256,216 | B1 | 7/2001 | Lien et al. |
| 6,339,540 | B1 | 1/2002 | Lavi |
| 7,177,183 | B2 | 2/2007 | Scheuerlein et al. |
| 2009/0190404 | A1 | 7/2009 | Roohparvar |
| 2015/0348628 | A1* | 12/2015 | Matsuoka ............ G11C 15/04 365/49.17 |

OTHER PUBLICATIONS

Introduction of 3D AND-type Flash Memory and It's Applications to Computing-in-Memory (CIM) (Year: 2021).*
"Notice of allowance of Taiwan Counterpart Application", dated Aug. 30, 2022, p. 1-p. 3.

* cited by examiner

*Primary Examiner* — Sultana Begum
(74) *Attorney, Agent, or Firm* — J.C. Patents

(57) ABSTRACT

A three dimension memory device and a ternary content addressable memory cell are provided. The ternary content addressable memory cell includes a first memory cell, a second memory cell, a first search switch, and a second search switch. The first memory cell is disposed in a first AND type flash memory line. The second memory cell is disposed in a second AND type flash memory line. The first search switch is coupled between a first bit line corresponding to the first AND type flash memory line and a match line, and is controlled by a first search signal to be turned on or cut off. The second search switch is coupled between a second bit line corresponding to the second AND type flash memory line and the match line, and is controlled by a second search signal to be turned on or cut off.

19 Claims, 7 Drawing Sheets

THREE DIMENSION MEMORY DEVICE AND TERNARY CONTENT ADDRESSABLE MEMORY CELL THEREOF

BACKGROUND

Technical Field

The disclosure relates to a three dimension memory device and a ternary content addressable memory cell thereof. Particularly, the disclosure relates to a three dimension memory device and a ternary content addressable memory cell thereof, in which power consumption in a search operation can be relatively saved.

Description of Related Art

In electronic devices, in order to provide a highly expressive look-up table, ternary content addressable memory cells with a high density and a high speed have become an important architecture.

It is a common choice to construct the ternary content addressable memory cells by utilizing non-volatile memory. However, electrical properties, such as the bit error rate, of the non-volatile memory are an important parameter to be considered.

In the conventional technical field, it is common that the ternary content addressable memory cells are constructed by utilizing an NOR type flash memory. However, with the limitation of the circuit structure of the NOR type flash memory, it may be difficult to a certain extent to configure a ternary content addressable memory cell array with a sufficiently high density by utilizing the NOR type flash memory.

SUMMARY

The disclosure provides a three dimension memory device and a ternary content addressable memory cell thereof, in which power consumption required for a search operation can be reduced.

The ternary content addressable memory cell of the disclosure includes a first memory cell, a second memory cell, a first search switch, and a second search switch. The first memory cell is disposed in a first AND type flash memory line. The second memory cell is disposed in a second AND type flash memory line. The first search switch is coupled between a first bit line corresponding to the first AND type flash memory line and a match line, and is controlled by a first search signal to be turned on or cut off. The second search switch is coupled between a second bit line corresponding to the second AND type flash memory line and the match line, and is controlled by a second search signal to be turned on or cut off.

The three dimension memory device of the disclosure includes an AND type flash memory bank and at least one ternary content addressable memory cell. The AND type flash memory bank includes at least one memory cell array tile. The ternary content addressable memory cell includes a first memory cell, a second memory cell, a first search switch, and a second search switch. The first memory cell is disposed in a first AND type flash memory line. The second memory cell is disposed in a second AND type flash memory line. The first search switch is coupled between a first bit line corresponding to the first AND type flash memory line and a match line, and is controlled by a first search signal to be turned on or cut off. The second search switch is coupled between a second bit line corresponding to the second AND type flash memory line and the match line, and is controlled by a second search signal to be turned on or cut off.

Based on the foregoing, in the three dimension memory device of the disclosure, two memory cells in different AND type flash memory lines are combined with each other and accompanied with the corresponding bit line switches to form the ternary content addressable memory cell. The bit line switches are taken as the search switches that reduce the power consumption required in the search operation of the ternary content addressable memory cell. Moreover, with the bit line switches taken as the search switches, not only may the layout area be saved, but the reliability may also be increased, effectively improving the overall performance of the ternary content addressable memory cell.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
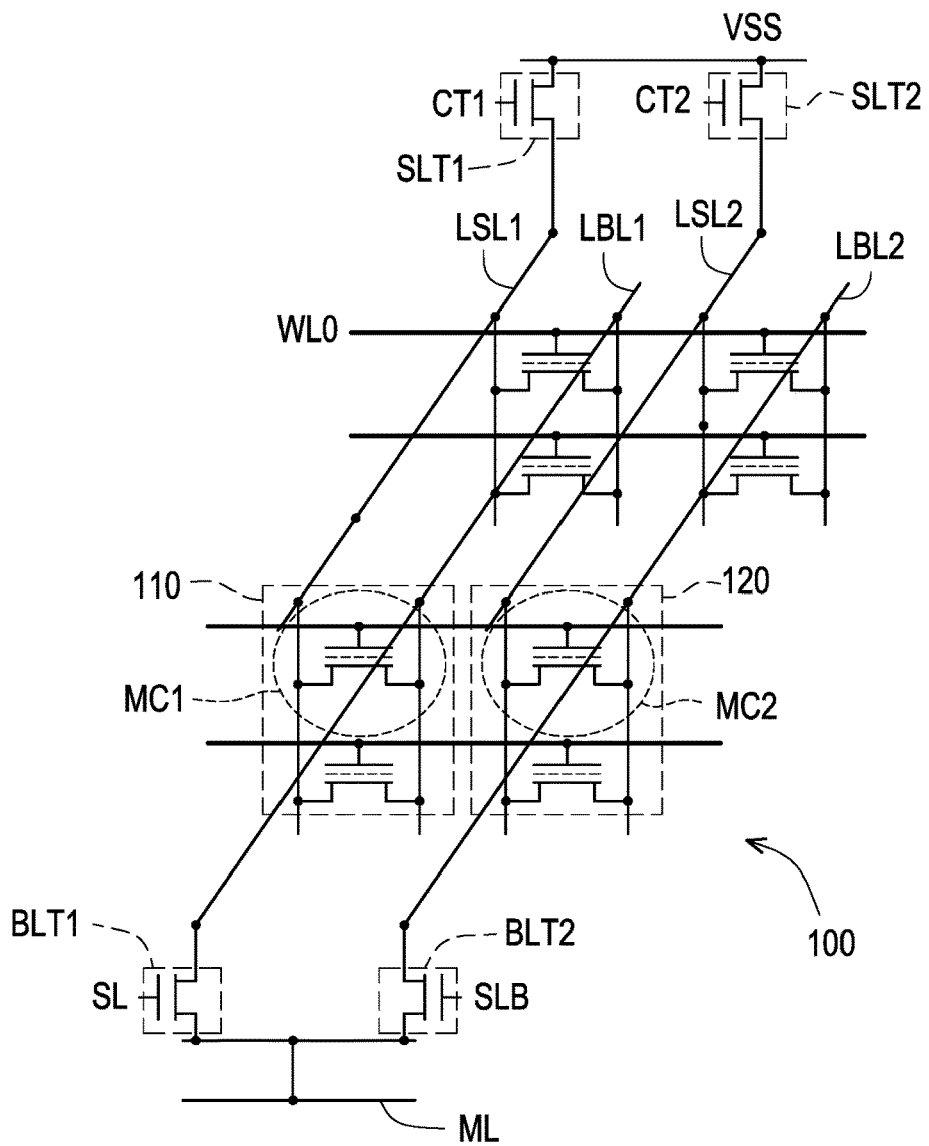
FIG. 1 is a schematic diagram illustrating a ternary content addressable memory cell according to an embodiment of the disclosure.

Reference may be made to FIG. 1, which is a schematic diagram illustrating a ternary content addressable memory cell according to an embodiment of the disclosure. A ternary content addressable memory cell 100 is disposed in an AND type flash memory device. The ternary content addressable memory cell 100 includes memory cells MC1, MC2, search switches BLT1, BLT2, and source line switches SLT1, SLT2. In this embodiment, the search switches BLT1, BLT2 and the source line switches SLT1, SLT2 may each be constructed by applying a transistor, for example, an N-type transistor. The memory cells MC1, MC2 may be flash memory cells.

The memory cells MC1, MC2 are respectively disposed in different AND type flash memory lines 110 and 120. The search switch BLT1 is coupled between a bit line LBL1 corresponding to the AND type flash memory line 110 and a match line ML. The search switch BLT2 is coupled between a bit line LBL2 corresponding to the AND type flash memory line 120 and the match line ML. In this embodiment, the search switches BLT1, BLT2 are bit line switches of the AND type flash memory device, and the match line ML may be a global bit line. The search switch BLT1 is controlled by a search signal SL to be turned on or cut off, and the search switch BLT2 is controlled by a search signal SLB to be turned on or cut off. Based on different search conditions, the search signal SL and the search signal SLB may be different voltage combinations. For example, during a search operation of a first logic state (e.g., logic 1), the search signals SL and SLB may respectively be a logic high voltage and a logic low voltage; during a search operation of a second logic state (e.g., logic 0), the search signals SL and SLB may respectively be a logic low voltage and a logic high voltage; and during a search operation of a third logic state (e.g., don't care), the search signals SL and SLB may each be a logic low voltage.

In addition, the source line switch SLT1 is coupled between a source line LSL1 corresponding to the AND type flash memory line 110 and a reference ground voltage VSS. The source line switch SLT2 is coupled between a source line LSL2 corresponding to the AND type flash memory line 120 and the reference ground voltage VSS. The source line switches SLT1, SLT2 are respectively controlled by control signals CT1, CT2. During the search operation of the ternary content addressable memory cell 100, the source line switches SLT1, SLT2 may be turned on according to the control signals CT1, CT2. The source line switches SLT1, SLT2 may be coupled to a common source line, and may receive the reference ground voltage VSS through the common source line.

In this embodiment, the memory cells MC1, MC2 are coupled to the same word line WL0. In other embodiments of the disclosure, the memory cells MC1, MC2 may also be respectively coupled to different word lines, which is not particularly limited.

Figure 2:
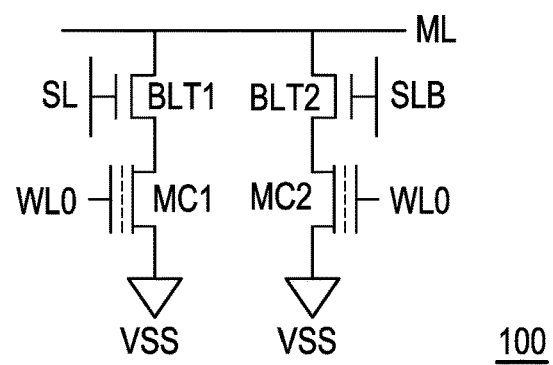
FIG. 2 is a schematic diagram illustrating an equivalent circuit of the ternary content addressable memory cell 100 in the embodiment of FIG. 1 of the disclosure.

In the following, reference may be made to FIG. 2, which is a schematic diagram illustrating an equivalent circuit of the ternary content addressable memory cell 100 in the embodiment of FIG. 1 of the disclosure. During the search operation, on the basis that the source line switches SLT1, SLT2 are each turned on, the memory cells MC1, MC2 may each receive the reference ground voltage VSS at one end. The memory cells MC1, MC2 are respectively coupled to the search switches BLT1, BLT2 at the other end. The search switches BLT1, BLT2 are coupled between the memory cells MC1, MC2 and the match line ML. The search switches BLT1 and BLT2 are respectively controlled by the search signals SL and SLB.

Figure 3A:
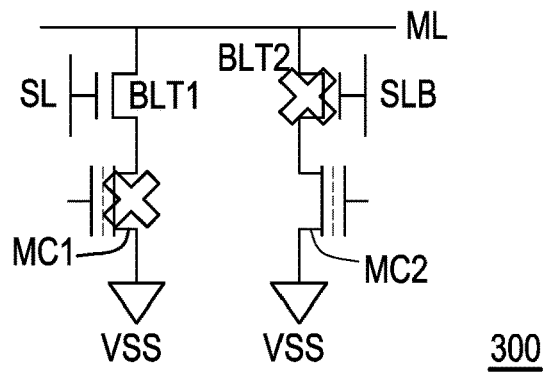
FIG. 3A to FIG. 5C are respectively schematic diagrams illustrating implementations of search operations of ternary content addressable memory cells according to embodiments of the disclosure.

For the detailed actions of the search operation, reference may be made to FIG. 3A to FIG. 5C, which are respectively schematic diagrams illustrating implementations of search operations of ternary content addressable memory cells according to embodiments of the disclosure. In FIG. 3A to FIG. 3C, a ternary content addressable memory cell 300 records data in the first logic state, the memory cell MC1 is in a programmed state, and the memory cell MC2 is in an erased state. In an initial time interval before the search operation of the first logic state, a match signal on the match line ML may be pre-charged to a reference voltage, where the reference voltage is greater than the reference ground voltage VSS.

In FIG. 3A, during the search operation of the first logic state, the search signal SL is a logic high voltage, and the search signal SLB is a logic low voltage. At this time, on the basis that the memory cell MC1 is cut off, and the search switch BLT2 is also cut off, no conductive path is present between the match line ML and the reference ground voltage VSS. Therefore, the match signal on the match line ML may be substantially maintained at the level of the reference voltage without change. At this time, it may be determined that the search result of the search operation of the first logic state is matched.

Figure 3B:
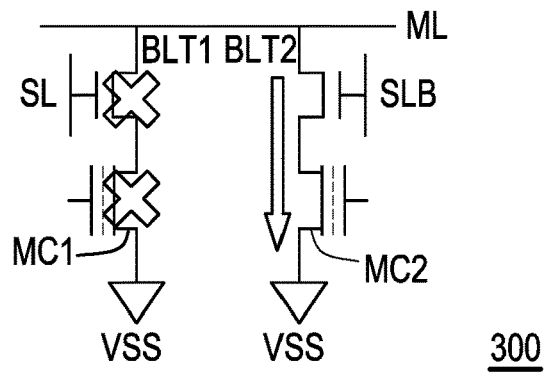

In FIG. 3B, during the search operation of the second logic state, the search signal SL is a logic low voltage, and the search signal SLB is a logic high voltage. At this time, on the basis that the memory cell MC2 and the search switch BLT2 are each turned on, the memory cell MC2 and the search switch BLT2 form a conductive path between the match line ML and the reference ground voltage VSS. Therefore, the match signal on the match line ML may drop to be equal to the reference ground voltage VSS. At this time, it may be determined that the search result of the search operation of the second logic state is un-matched.

Figure 3C:
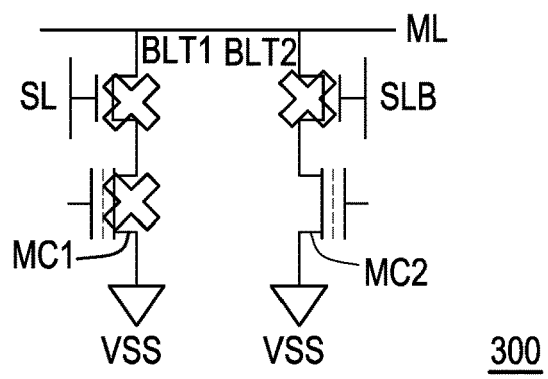

In FIG. 3C, during the search operation of the third logic state, the search signal SL is a logic low voltage, and the search signal SLB is also a logic low voltage. At this time, on the basis that the memory cell MC1 and the search switches BLT2, BLT1 are each cut off, no conductive path is present between the match line ML and the reference ground voltage VSS. Therefore, the match signal on the match line ML may be substantially maintained at the level of the reference voltage without change. At this time, it may be determined that the search result of the search operation of the third logic state is matched.

Figure 4A:
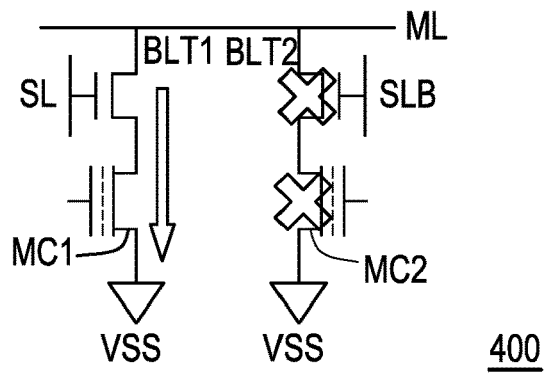
Figure 4B:
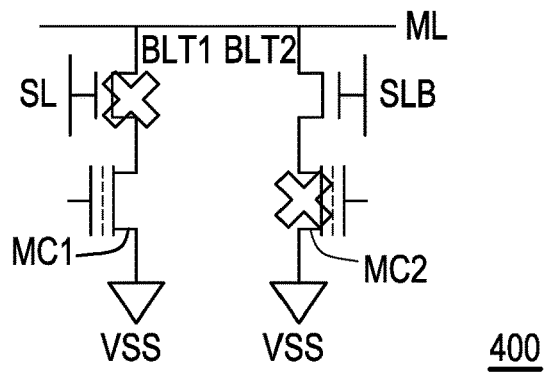
Figure 4C:
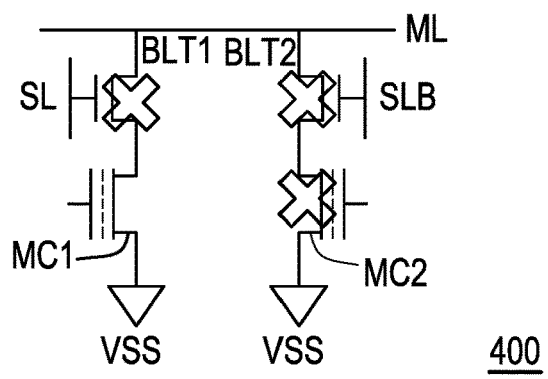

In FIG. 4A to FIG. 4C, a ternary content addressable memory cell 400 records data in the second logic state, the memory cell MC2 is the programmed state, and the memory cell MC1 is the erased state. In an initial time interval before the search operation of the first logic state, the match signal on the match line ML may be pre-charged to a reference voltage, where the reference voltage is greater than the reference ground voltage VSS.

In FIG. 4A, during the search operation of the first logic state, the search signal SL is a logic high voltage, and the search signal SLB is a logic low voltage. At this time, on the basis that the memory cell MC1 and the search switch BLT1 are each turned on, the memory cell MC1 and the search switch BLT1 form a conductive path between the match line ML and the reference ground voltage VSS. Therefore, the match signal on the match line ML may drop to be equal to the reference ground voltage VSS. At this time, it may be determined that the search result of the search operation of the second logic state is un-matched.

In FIG. 4B, during the search operation of the second logic state, the search signal SL is a logic low voltage, and the search signal SLB is a logic high voltage. At this time, on the basis that the memory cell MC2 and the search switch BLT1 are each cut off, no conductive path is present between the match line ML and the reference ground voltage VSS. Therefore, the match signal on the match line ML may be maintained equal to the reference voltage without change. At this time, it may be determined that the search result of the search operation of the second logic state is matched.

In FIG. 4C, during the search operation of the third logic state, the search signal SL is a logic low voltage, and the search signal SLB is also a logic low voltage. At this time, on the basis that the memory cell MC2 and the search switch BLT2, BLT1 are each cut off, no conductive path is present between the match line ML and the reference ground voltage VSS. Therefore, the match signal on the match line ML may be substantially maintained at the level of the reference voltage without change. At this time, it may be determined that the search result of the search operation of the third logic state is matched.

Figure 5A:
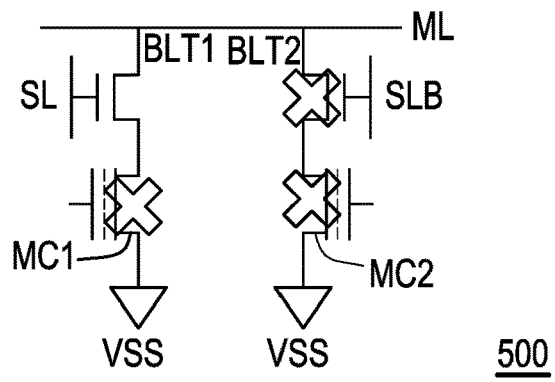
Figure 5B:
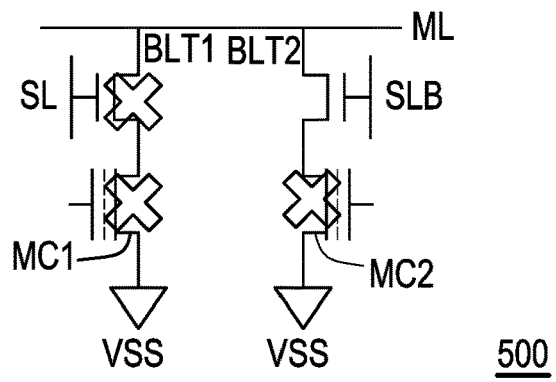
Figure 5C:
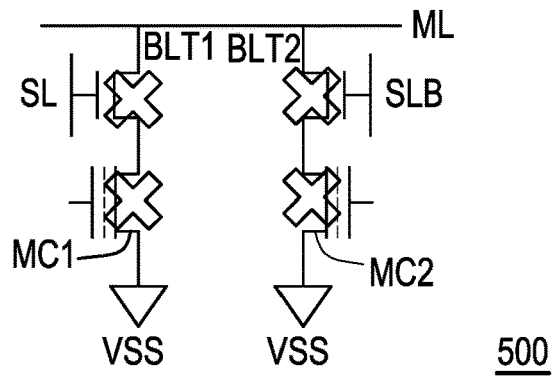

In FIG. 5A to FIG. 5C, a ternary content addressable memory cell 500 records data in the third logic state, and the memory cells MC1, MC2 are each in a programmed state. In an initial time interval before the search operation of the third logic state, the match signal on the match line ML may be pre-charged to a reference voltage, where the reference voltage is greater than the reference ground voltage VSS.

In FIG. 5A, during the search operation of the first logic state, the search signal SL is a logic high voltage, and the search signal SLB is a logic low voltage. At this time, on the basis that the memory cells MC1, MC2 are each cut off, and the search switch BLT2 is also cut off, no conductive path is present between the match line ML and the reference ground voltage VSS. Therefore, the match signal on the match line ML may be substantially maintained at the level of the reference voltage without change. At this time, it may be determined that the search result of the search operation of the first logic state is matched.

In FIG. 5B, during the search operation of the second logic state, the search signal SL is a logic low voltage, and the search signal SLB is a logic high voltage. At this time, on the basis that the memory cells MC1, MC2 and the search switch BLT1 are each cut off, no conductive path is present between the match line ML and the reference ground voltage VSS. Therefore, the match signal on the match line ML may be substantially maintained at the level of the reference voltage without change. At this time, it may be determined that the search result of the search operation of the third logic state is matched.

In FIG. 5C, during the search operation of the third logic state, the search signal SL is a logic low voltage, and the search signal SLB is also a logic low voltage. At this time, on the basis that the memory cells MC1, MC2 and the search switches BLT2, BLT1 are each cut off, no conductive path is present between the match line ML and the reference ground voltage VSS. Therefore, the match signal on the match line ML may be substantially maintained at the level of the reference voltage without change. At this time, it may be determined that the search result of the search operation of the third logic state is matched.

It is worth noting that, in the embodiments of FIG. 3A to FIG. 5C, the first logic state is complementary to the second logic state, and the third logic state is don't care. To be specific, the first logic state may be logic 1 (or logic 0), and the second logic state may be logic 0 (or logic 1).

In addition, in other embodiments of the disclosure, during the search operations of the various states, the configuration of the voltage values of the search signals SL and SLB may be different from the above description. In other embodiments of the disclosure, in the search operation of the first logic state, the search signals SL and SLB may respectively be a logic low voltage and a logic high voltage; in the search operation of the second logic state, the search signals SL and SLB may respectively be a logic high voltage and a logic low voltage; and in the search operation of the third logic state, the search signals SL and SLB may each be a logic high voltage. Moreover, when the ternary content addressable memory cell records data in the third logic state, the memory cells MC1, MC2 are each in an erased state. Under such conditions, in the search operations of the logic states, when the match signal on the match line ML is maintained equal to the reference voltage, it means that the search result is un-matched; and when the match signal on the match line ML drops to the reference ground voltage, it means that the search result is matched.

Figure 6A:
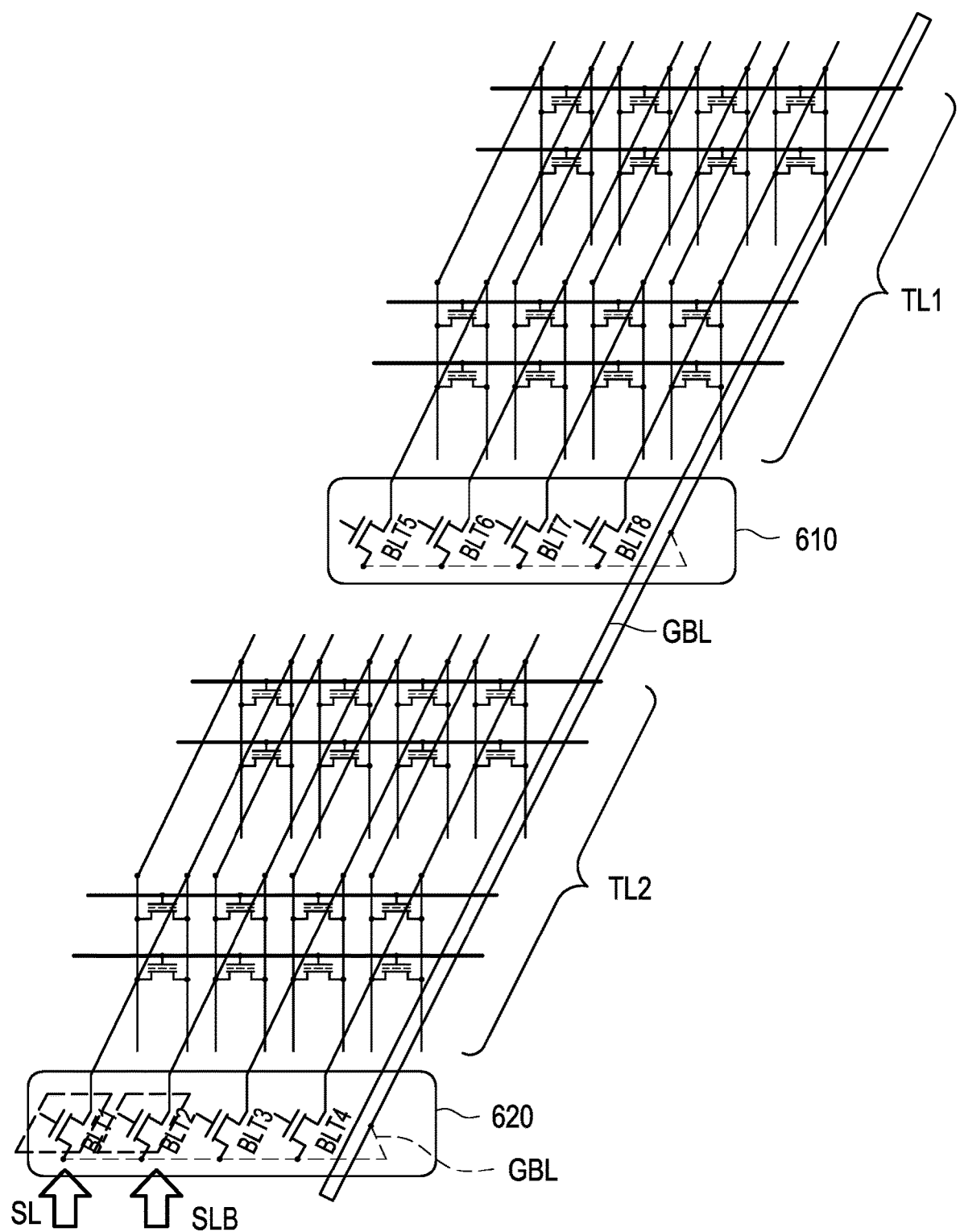
FIG. 6A and FIG. 6B are schematic diagrams illustrating different configurations of search switches of a three dimension memory device and a ternary content addressable memory cell according to embodiments of the disclosure.

In the following, reference may be made to FIG. 6A and FIG. 6B, which are schematic diagrams illustrating different configurations of search switches of a three dimension memory device and a ternary content addressable memory cell according to embodiments of the disclosure. In FIG. 6A, a three dimension memory device 600 has a memory bank, and the memory bank includes a plurality of memory cell array tiles TL1, TL2. The memory cell array tiles TL1, TL2 respectively have corresponding bit line switch areas 610, 620. Bit line switches BLT5 to BLT8 are in the bit line switch area 610, and bit line switches BLT1 to BLT4 are in the bit line switch area 620.

One or more ternary content addressable memory cells may be disposed in the three dimension memory device 600. In this embodiment, corresponding to one of the ternary content addressable memory cells, the bit line switches BLT1, BLT2 may serve as two search switches of the ternary content addressable memory cell. In other words, two search switches corresponding to the same ternary content addressable memory cell may be disposed in the same memory cell array tile TL2. The bit line switches BLT1 and BLT2 are respectively controlled by the search signals SL and SLB.

It is worth noting that, in this embodiment, the bit line switches BLT1 to BLT4 and the bit line switches BLT5 to BLT8 may be commonly coupled to a global bit line GBL.

Figure 6B:
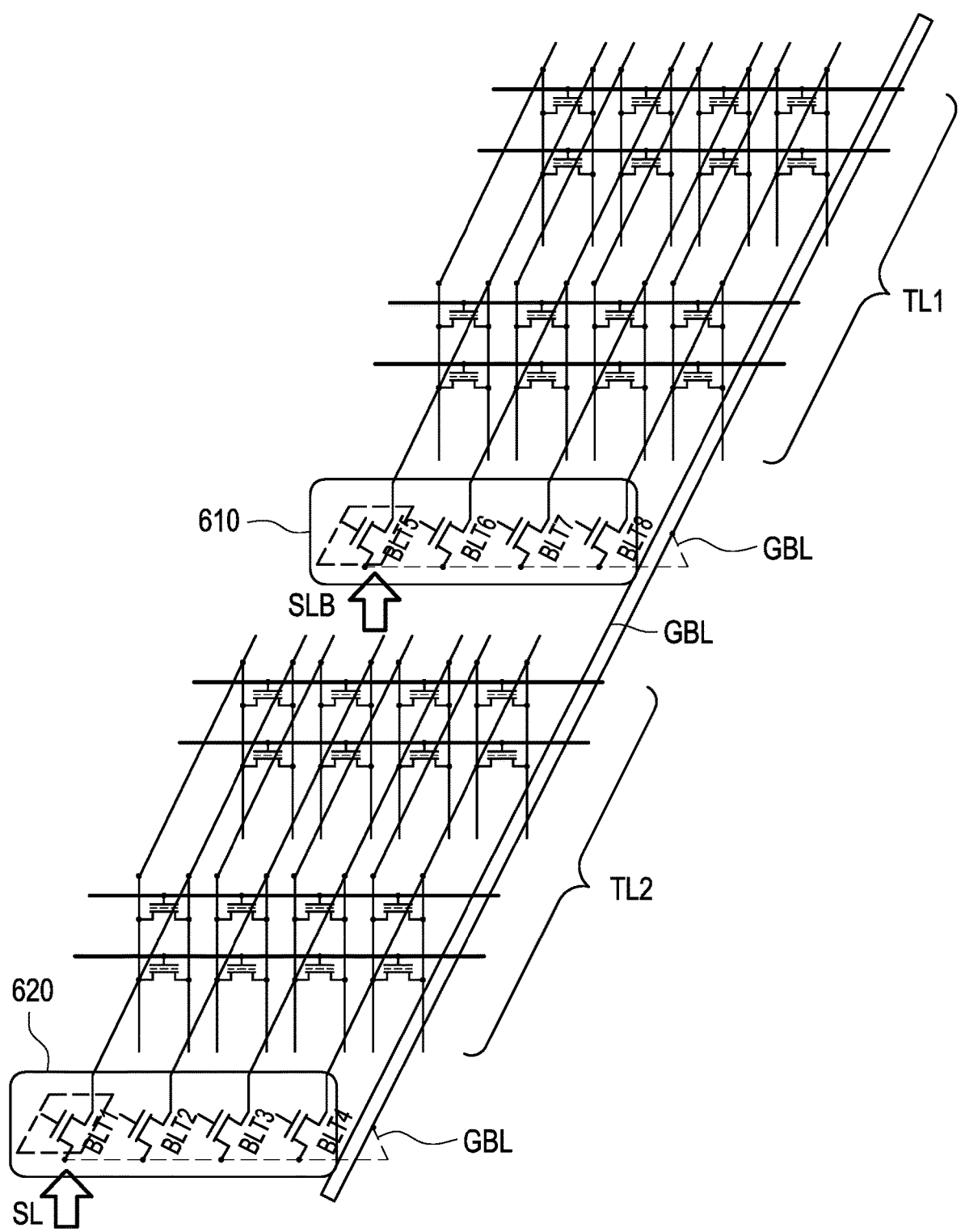

In FIG. 6B, the two search switches corresponding to one ternary content addressable memory cell may be the bit line switches BLT1 and BLT5. In other words, the two search switches corresponding to the same ternary content addressable memory cell may also be respectively disposed in the different memory cell array tiles TL1, TL2. The bit line switches BLT1 and BLT5 are respectively controlled by the search signals SL and SLB.

Figure 7:
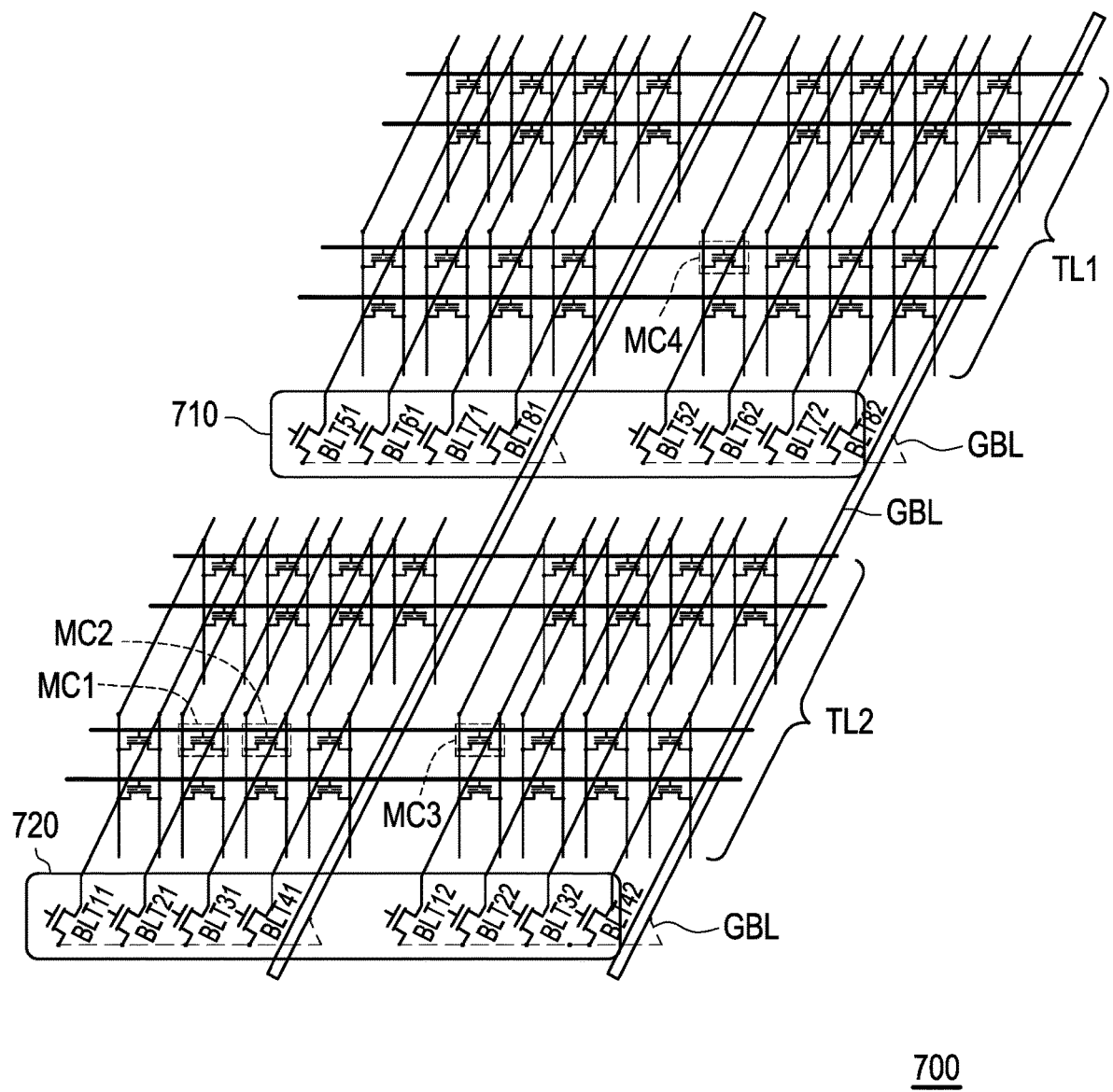
FIG. 7 is a schematic diagram illustrating a different configuration of a three dimension memory device and a ternary content addressable memory cell according to an embodiment of the disclosure.

In the following, reference may be made to FIG. 7, which is a schematic diagram illustrating a different configuration of a three dimension memory device and a ternary content addressable memory cell according to an embodiment of the disclosure. In FIG. 7, a three dimension memory device 700 has a memory bank, and the memory bank includes a plurality of memory cell array tiles TL1, TL2. The memory cell array tiles TL1 and TL2 respectively have corresponding bit line switch areas 710 and 720. Bit line switches BLT51 to BLT81 and BLT52 to BLT82 are in the bit line switch area 710, and bit line switches BLT11 to BLT41 and BLT12 to BLT42 are in the bit line switch area 720.

In this embodiment, a plurality of ternary content addressable memory cells may be disposed in the three dimension memory device 700. A first ternary content addressable memory cell includes the memory cells MC1, MC2. The memory cells MC1, MC2 are disposed in the same memory cell array tile TL2. Moreover, the memory cells MC1, MC2 are arranged in pairs in two adjacent memory lines. Corresponding to the memory cells MC1 and MC2, the bit line switches BT21 and BT31 may serve as search switches. The bit line switches BT21 and BT31 are commonly coupled to the global bit line GBL. The global bit line GBL may serve as a match line of the ternary content addressable memory cell.

Furthermore, a second ternary content addressable memory cell includes memory cells MC3, MC4. The memory cells MC3, MC4 are respectively disposed in the different memory cell array tiles TL1, TL2. Corresponding to the memory cells MC3 and MC4, the bit line switches BT12 and BT52 may serve as the search switches. It is worth noting that the bit line switches BT12 and BT52 are commonly coupled to the global bit line GBL. The global bit line GBL may serve as a match line of the ternary content addressable memory cell.

It is worth noting that, in the embodiments of the disclosure, one or more ternary content addressable memory cells may be disposed in the three dimension memory device. The three dimension memory device may have a plurality of memory cell array tiles. The ternary content addressable memory cells may each be disposed in a single memory cell array tile, or may as well be scattered in a plurality of different memory cell array tiles, which is not particularly limited.

In summary of the foregoing, the ternary content addressable memory cell of the disclosure is disposed in the AND type flash memory device. The bit line switches is taken as the search switches, and the global bit line is taken as the match line. Accordingly, the voltages of the search signals received by the search switches may be less than the voltages on the corresponding word lines, saving the required power consumption. In addition, a single bit line switch may be constructed by utilizing a single transistor. Moreover, under the premise that it is not required to increase the voltages of the search signals, the configuration of the level shifter circuit may be omitted, effectively reducing the circuit area. Furthermore, in the search operations, the search switches provide at most one current path through the corresponding bit line, effectively increasing the reliability of the circuit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A ternary content addressable memory cell, comprising:
   a first memory cell, disposed in a first AND type flash memory line;
   a second memory cell, disposed in a second AND type flash memory line;
   a first search switch, coupled between a first bit line corresponding to the first AND type flash memory line and a match line, wherein the first search switch is controlled by a first search signal to be turned on or cut off; and
   a second search switch, coupled between a second bit line corresponding to the second AND type flash memory line and the match line, wherein the second search switch is controlled by a second search signal to be turned on or cut off,
   wherein in response to the first memory cell being in a programmed state and the second memory cell being in an erased state, data stored in the ternary content addressable memory cell is in a first logic state;
   wherein in response to the first memory cell being in an erased state and the second memory cell being in a programmed state, the data stored in the ternary content addressable memory cell is in a second logic state;
   wherein in response to the first memory cell and the second memory cell each being in the programmed state, the data stored in the ternary content addressable memory cell is in a third logic state.

2. The ternary content addressable memory cell according to claim 1, further comprising:
   a first source line switch, coupled between a first source line corresponding to the first AND type flash memory line and a reference ground voltage, wherein the first source line switch is controlled by a control signal to be turned on or cut off; and
   a second source line switch, coupled between a second source line corresponding to the second AND type flash memory line and the reference ground voltage, wherein the second source line switch is controlled by the control signal to be turned on or cut off.

3. The ternary content addressable memory cell according to claim 1, wherein the first memory cell and the second memory cell are coupled to a same word line, or respectively coupled to two different word lines.

4. The ternary content addressable memory cell according to claim 1, wherein
   the first search switch comprises:
   a first transistor, having a first terminal coupled to the first bit line, a second terminal coupled to the match line, and a control terminal receiving the first search signal, and
   the second search switch comprises:
   a second transistor, having a first terminal coupled to the second bit line, a second terminal coupled to the match line, and a control terminal receiving the second search signal.

5. The ternary content addressable memory cell according to claim 1, wherein the first logic state is complementary to the second logic state, and the third logic state is don't care.

6. The ternary content addressable memory cell according to claim 1, wherein during a search operation of the first logic state, the first search switch is turned on and the second search switch is cut off; during a search operation of the second logic state, the first search switch is cut off and the second search switch is turned on; and during a search operation of the third logic state, the first search switch and the second search switch are each cut off.

7. The ternary content addressable memory cell according to claim 1, wherein in an initial time interval during a search operation, a match signal on the match line is pre-charged to a reference voltage.

8. The ternary content addressable memory cell according to claim 7, wherein the reference voltage is greater than a reference ground voltage received by the ternary content addressable memory cell.

9. The ternary content addressable memory cell according to claim 8, wherein during the search operation, in response to a search result being matched, the match signal is maintained equal to the reference voltage, and in response to the search result being un-matched, the match signal is pulled down to the reference ground voltage.

10. The ternary content addressable memory cell according to claim 8, wherein during the search operation, in response to a search result being un-matched, the match signal is maintained equal to the reference voltage, and in response to the search result being matched, the match signal is pulled down to the reference ground voltage.

11. The ternary content addressable memory cell according to claim 1, wherein the match line is a global bit line of an AND type flash memory bank.

12. The ternary content addressable memory cell according to claim 11, wherein the AND type flash memory bank has at least one memory cell array tile, wherein the first AND type flash memory line and the second AND type flash memory line are located in a same first memory cell array tile, or the first AND type flash memory line and the second AND type flash memory line are respectively located in a first memory cell array tile and a second memory cell array tile that are different.

13. The ternary content addressable memory cell according to claim 12, wherein the first search switch and the second search switch are disposed in the same first memory cell array tile, or respectively disposed in the first memory cell array tile and the second memory cell array tile that are different.

14. A three dimension memory device, comprising:
- an AND type flash memory bank, comprising at least one memory cell array tile; and
- at least one ternary content addressable memory cell, comprising:
  - a first memory cell, disposed in a first AND type flash memory line;
  - a second memory cell, disposed in a second AND type flash memory line;
  - a first search switch, coupled between a first bit line corresponding to the first AND type flash memory line and a match line, wherein the first search switch is controlled by a first search signal to be turned on or cut off; and
  - a second search switch, coupled between a second bit line corresponding to the second AND type flash memory line and the match line, wherein the second search switch is controlled by a second search signal to be turned on or cut off,
  - wherein in response to the first memory cell being in a programmed state and the second memory cell being in an erased state, data stored in the ternary content addressable memory cell is in a first logic state;
  - wherein in response to the first memory cell being in an erased state and the second memory cell being in a programmed state, the data stored in the ternary content addressable memory cell is in a second logic state;
  - wherein in response to the first memory cell and the second memory cell each being in the programmed state, the data stored in the ternary content addressable memory cell is in a third logic state.

15. The three dimension memory device according to claim 14, wherein the first AND type flash memory line and the second AND type flash memory line are located in a same first memory cell array tile, or the first AND type flash memory line and the second AND type flash memory line are respectively located in a first memory cell array tile and a second memory cell array tile that are different.

16. The three dimension memory device according to claim 14, wherein the first search switch and the second search switch are disposed in the same first memory cell array tile, or respectively disposed in the first memory cell array tile and the second memory cell array tile that are different.

17. The three dimension memory device according to claim 14, wherein the at least one ternary content addressable memory cell further comprises:
- a first source line switch, coupled between a first source line corresponding to the first AND type flash memory line and a reference ground voltage, wherein the first source line switch is controlled by a control signal to be turned on or cut off; and
- a second source line switch, coupled between a second source line corresponding to the second AND type flash memory line and the reference ground voltage, wherein the second source line switch is controlled by the control signal to be turned on or cut off.

18. The three dimension memory device according to claim 14, wherein the first memory cell and the second memory cell are coupled to a same word line, or respectively coupled to two different word lines.

19. The three dimension memory device according to claim 14, wherein
- the first search switch comprises:
  - a first transistor, having a first terminal coupled to the first bit line, a second terminal coupled to the match line, and a control terminal receiving the first search signal, and
- the second search switch comprises:
  - a second transistor, having a first terminal coupled to the second bit line, a second terminal coupled to the match line, and a control terminal receiving the second search signal.

\* \* \* \* \*